United States Patent
Uematsu et al.

(10) Patent No.: US 6,684,371 B2
(45) Date of Patent: Jan. 27, 2004

(54) LAYOUT OF SEMICONDUCTOR INTEGRATED CIRCUIT

(75) Inventors: Katsuyuki Uematsu, Nagano (JP); Mutsuo Nishikawa, Nagano (JP); Katsumichi Ueyanagi, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/117,340

(22) Filed: Apr. 8, 2002

(65) Prior Publication Data

US 2002/0152448 A1 Oct. 17, 2002

(30) Foreign Application Priority Data

Apr. 12, 2001 (JP) ........................................ 2001-114331

(51) Int. Cl.[7] .............................................. G06F 17/50
(52) U.S. Cl. .................................. 716/1; 716/8; 716/10; 716/11
(58) Field of Search ........................................ 716/1–18

(56) References Cited

U.S. PATENT DOCUMENTS 5,182,531 A * 1/1993 Fiedler et al. ............. 333/167
5,789,797 A * 8/1998 Ikuta et al. ................ 257/533
6,524,941 B2 * 2/2003 Hsu et al. .................. 438/601

FOREIGN PATENT DOCUMENTS

JP      11-186497      7/1999

* cited by examiner

*Primary Examiner*—Matthew Smith
*Assistant Examiner*—Paul Dinh
(74) *Attorney, Agent, or Firm*—Kanesaka & Takeuchi

(57) ABSTRACT

To improve the capability to withstand noises and surges in a semiconductor integrated circuit in which an RC filter for cutting electromagnetic wave noises is integrated with analog circuits and digital circuits, a positive electrode of a capacitor constituting the RC filter is disposed apart from circuit elements or connection lines constituting the circuits at such an interval as to prevent malfunction of the circuit elements resulting from a noise superimposed on the positive electrode, or dielectric breakdown of the capacitor constituting the RC filter and latch-up and dielectric breakdown of the circuit elements resulting from a surge applied to the positive electrode. The interval is larger than the minimum interval required by a layout rule or five times longer than the minimum.

1 Claim, 8 Drawing Sheets

LAYOUT OF SEMICONDUCTOR INTEGRATED CIRCUIT

BACKGROUND OF THE INVENTION AND RELATED ART STATEMENT

The present invention relates to a layout of a semiconductor integrated circuit, and more particularly to a layout of a semiconductor integrated circuit wherein resistance-capacitor (RC) filter circuits are integrated with analog circuits and digital circuits. The resultant layout enables the semiconductor integrated circuit to effectively deal with surges and noises.

In recent years, to deal with electromagnetic wave noises in semiconductor integrated circuits, some integrated circuit (IC) chips have been provided with filter circuits for cutting electromagnetic wave noises from outside. For example, in IC chips for use in automobiles and the like, a single stage RC filter comprised of a resistance and a capacitor or a multistage RC filter such as a secondary filter is connected to a power supply line or an input/output signal line in an integrated circuit.

Since the RC filter is connected to the power supply line or input/output signal line in the integrated circuit, however, a surge is likely to be applied to the RC filter via a pad connected to the line. If the surge is applied to a high voltage side electrode of a capacitor constituting the RC filter, electric fields are concentrated between the electrode and peripheral circuit elements or lines. This may cause dielectric breakdown of the capacitor to break the filter circuits.

Further, since the electrode of the capacitor constituting the RC filter is formed in a wide area on the IC chip, the electrode of the capacitor tends to be positioned close to analog circuits and digital circuits in a layout of the integrated circuit. In such a layout, when a noise is superimposed on the electrode of the capacitor, the noise is likely to be transmitted to peripheral circuits to cause malfunction thereof. Namely, the integrated circuit will not withstand the noise. Also, the application of the surge has a significant effect, and is likely to cause latch-up and dielectric breakdown of the peripheral circuits.

To improve the performance against the noise and surge, several approaches have been developed. Using an insulation layer with high dielectric resistance and low dielectric constant is one of them. However, a special material used for the insulation layer requires a high development cost and a long optimization time, and it is necessary to solve issues on productivity and other potential risks.

It is therefore an object of the present invention to provide a layout of a semiconductor circuit wherein an RC filter for cutting electromagnetic wave noises is integrated with analog circuits and digital circuits, and the layout improves the capability to withstand noises and surges with a relatively low cost and short turnaround.

SUMMARY OF THE INVENTION

To accomplish the above object, the present invention provides a layout of a semiconductor integrated circuit in which an RC filter for eliminating electromagnetic wave noises is integrated with analog circuits and digital circuits on the same circuit board. In the semiconductor integrated circuit, a high voltage side electrode of a capacitor constituting the RC filter is disposed apart from a circuit element or line of the analog circuits and digital circuits at such an interval as to prevent the circuit element from malfunctioning due to a noise superimposed on the high voltage side electrode or to prevent dielectric breakdown of the capacitor, latch-up or dielectric breakdown of the circuit element caused by a surge applied to the high voltage side electrode. Specifically, the interval between the high voltage side electrode of the capacitor constituting the RC filter and the circuit element or line of analog circuits and the likes positioned closest to the RC filter is not less than a minimum interval required by a layout rule, or is five times longer the minimum interval required by the layout rule if a safety margin is considered.

According to the present invention, the high voltage side electrode of the capacitor constituting the RC filter is disposed apart from circuit elements or lines constituting analog circuits and digital circuits at such an interval as to prevent the circuit element from malfunctioning due to the noise superimposed on the high voltage side electrode or to prevent dielectric breakdown of the capacitor constituting the RC filter and latch-up or dielectric breakdown of the circuit element caused by the surge applied to the high voltage side electrode.

If the RC filter is a secondary or a higher stage filter in the layout according to the present invention, it is preferred that a high voltage side electrode of the primary side filter capacitor, which is most susceptible to a noise and surge from outside among all capacitors constituting the RC filter, is positioned apart from circuit elements or lines constituting the analog circuits and digital circuits at such an interval as to prevent malfunction of the circuit elements caused by the noise superimposed on the high voltage side electrode or to prevent dielectric breakdown of the capacitor constituting the RC filter and latch-up or dielectric breakdown of the circuit elements caused by the surge applied to the high voltage side electrode. Here, the primary side filter capacitor is a capacitor that is positioned closest to the pad on the chip that a line noise or the like enters.

According to the present invention, in the case where the RC filter constitutes a secondary or a higher stage filter, the high voltage side electrode of the primary filter capacitor is disposed apart from circuit elements or lines constituting the analog circuits and digital circuits at such an interval as to prevent malfunction of the circuit elements caused by the noise superimposed on the high voltage side electrode or to prevent dielectric breakdown of the capacitor constituting the RC filter and latch-up or dielectric breakdown of the circuit elements caused by the surge applied to the high voltage side electrode.

Further, if the RC filter constitutes a secondary or a higher stage filter, capacitors are arranged inward from the periphery to inside of an IC chip; for example, a primary filter capacitor is disposed at the outer periphery of the IC chip, a secondary filter capacitor is disposed inside the primary filter capacitor, and a tertiary filter capacitor inside the secondary filter capacitor. Circuit elements other than the RC filter are arranged at the innermost side of the chip.

According to the present invention, the primary filter capacitor is disposed at the outer periphery of the IC chip, the secondary and higher stage capacitors are arranged in the order of stage inside the primary filter capacitor, and the circuit elements other than the RC filter are arranged at the innermost side of the IC chip.

DETAILED DESCRIPTION OF PREFERRED EMBODIMENTS

Hereunder, preferred embodiments of the present invention will be described in detail with reference to the accompanied drawings.

Figure 1:
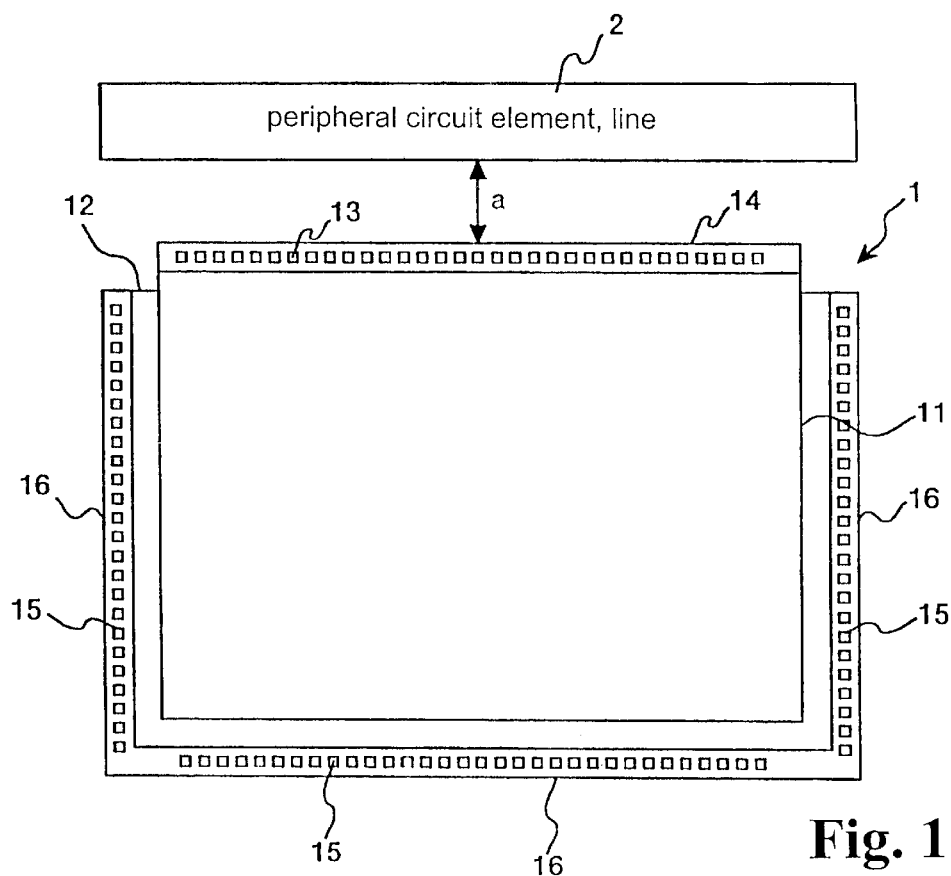
FIG. 1 is a schematic diagram showing a principal part of a layout of a semiconductor integrated circuit according to an embodiment of the present invention.

FIG. 1 is a schematic diagram showing a principal part of the layout of a semiconductor integrated circuit according to an embodiment of the present invention. In FIG. 1, reference numeral 1 denotes a capacitor that constitutes an RC filter and has a positive electrode (high voltage side electrode) 11 formed of poly-silicon and a negative electrode 12 formed of an impurity diffusion layer, for example. The positive electrode 11 is electrically connected to a first metal line 14 serving as a power supply line or signal line via contact portions 13. The positive electrode 12 is electrically connected to a second metal line 16 serving as a ground line via contact portions 15.

The area of the positive electrode 11 depends on the capacitance of a capacitor, which is necessary for eliminating noises. Thus, a capacitor has a large capacitance value in an IC for use in such an environment as automobile that is subject to higher level of noises than an IC for use in ordinary household electronic equipment. Particularly in such an environment, the first metal line 14 is wired over a wide range in an IC chip, and therefore, the first metal line 14 is likely to be close to a peripheral circuit elements constituting analog circuits and digital circuits or other lines 2. If a distance or interval between the first metal line 14 and the circuit elements or lines 2 (as shown as "a" in FIG. 1) is too small, a noise superimposed on the positive electrode 11 of the capacitor 1 is easily transmitted to the circuit elements or lines 2 to thereby cause malfunction thereof.

To address this problem, in the layout according to the present embodiment, the first metal line 14 is provided apart from the peripheral circuit elements or lines 2 at such an interval as to prevent the circuit elements from malfunctioning due to a noise superimposed on the positive electrode 11 of the capacitor 1. Further, the metal line 14 is provided apart from the peripheral circuit elements or lines 2 at such an interval as to prevent insulation breakdown of the capacitor 1 or latch-up or dielectric breakdown of the circuit element caused by a surge applied to the positive electrode 11.

Specifically, although no particular limitation is imposed, the interval "a" between the first metal line 14 and the peripheral circuit elements or lines 2 is, for example, not less than the minimum interval required by a layout rule or about five times as long as the minimum interval required by the layout rule if a safety margin is considered. For example, if the minimum interval required by the layout rule is 2 $\mu$m, the interval "a" is 10 $\mu$m. It should be noted that the value 10 $\mu$m is only an example, and actually, the interval is preferably determined with reference to a breakdown voltage of an insulating film or the like according to an actual process.

Figure 2:
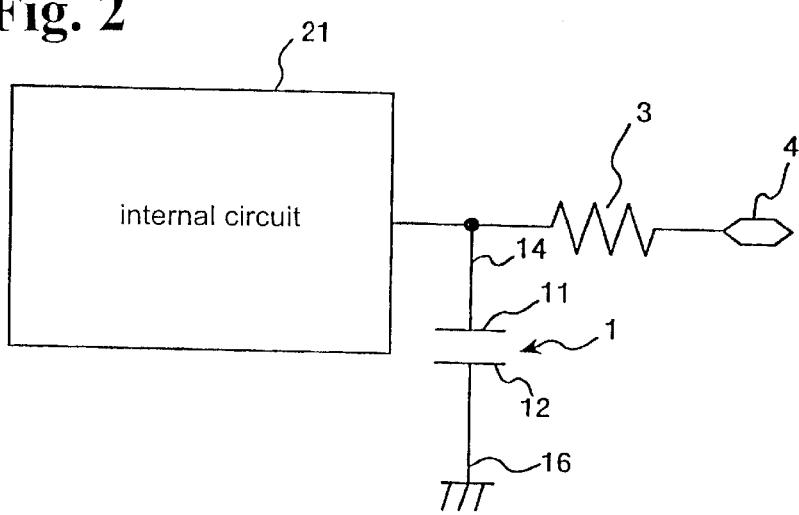
FIG. 2 is a diagram showing an equivalent circuit of the semiconductor integrated circuit, which constitutes the layout in FIG. 1.

FIG. 2 is a diagram showing an equivalent circuit of the semiconductor integrated circuit, which constitutes the layout in FIG. 1. It should be noted that parts and elements in FIG. 2 corresponding to those in FIG. 1 are denoted by the same reference numerals. In FIG. 2, reference numeral 3 denotes a resistance that constitutes the RC filter together with the capacitor 1; reference numeral 4 denotes a power supply pad or a signal input/output pad; and reference numeral 21 denotes an internal circuit comprised of analog circuits and digital circuits. The RC filter connected to the pad 4 cuts electromagnetic wave noises entering the integrated circuit from outside.

According to the above-described embodiment, a noise superimposed on the positive electrode 11 of the capacitor 1 constituting the RC filter can be inhibited from being transmitted to peripheral analog circuits and digital circuits. This prevents malfunction and breakdown of the circuits. Further, even if a surge is applied to the positive electrode 11 of the capacitor 1, the concentration of electric fields occurring between the positive electrode 11 and the peripheral circuit elements and lines can be alleviated to prevent dielectric breakdown of the capacitor 1.

Figure 3:
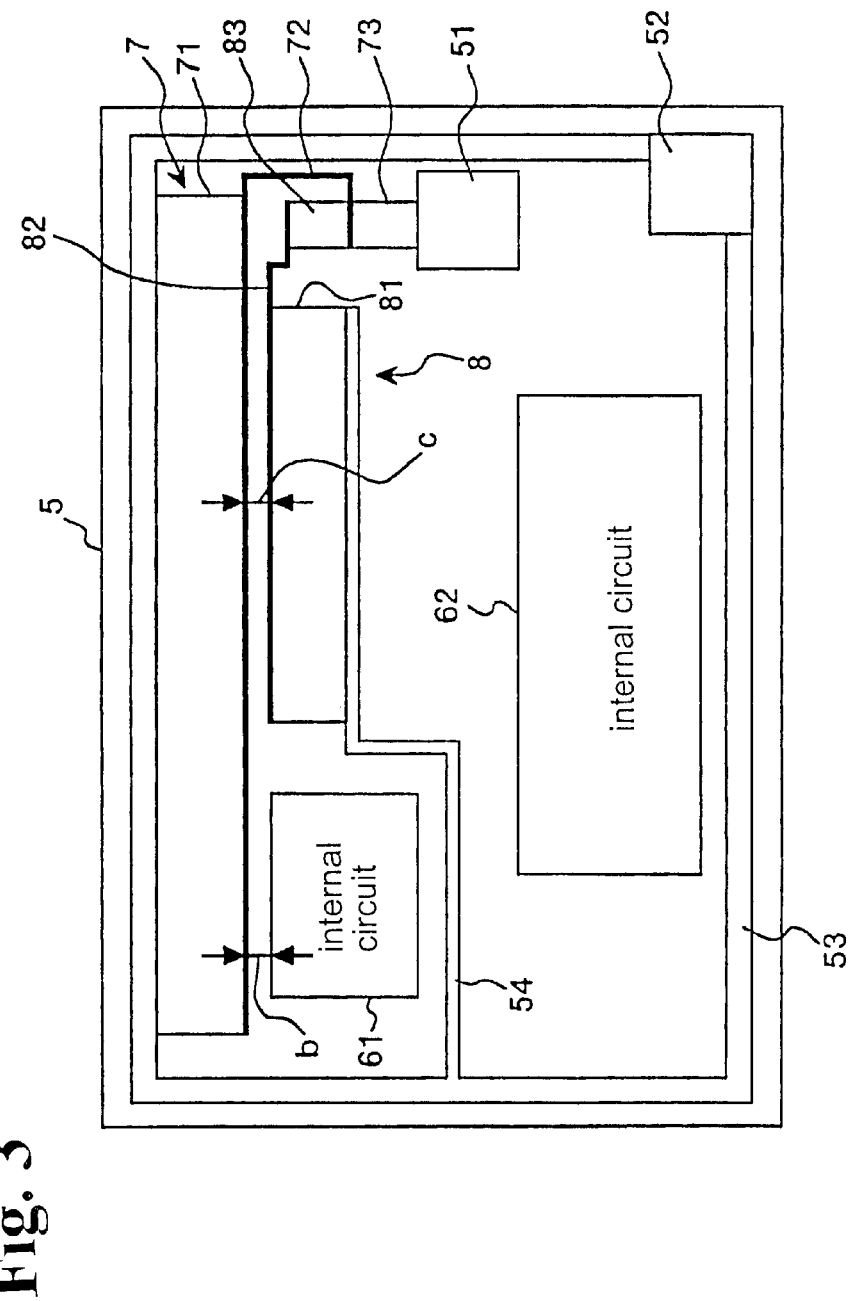
FIG. 3 is a schematic diagram showing a principal part of a layout of a semiconductor integrated circuit according to another embodiment of the present invention.

FIG. 3 is a schematic diagram showing a principal part of the layout of a semiconductor integrated circuit according to another embodiment of the present invention. In FIG. 3, reference numeral 5 denotes an IC chip in which RC filter circuits constituting a secondary filter are integrated with internal circuits 61 and 62; reference numeral 7 denotes a capacitor constituting a primary filter of the RC filter (hereinafter referred to as "primary filter capacitor"); reference numeral 71 denotes a positive electrode that is a high voltage side electrode of the primary filter capacitor 7 (hereinafter referred to as "primary filter capacitor electrode"); reference numeral 8 denotes a capacitor constituting a secondary filter of the RC filter (hereinafter referred to as "secondary filter capacitor"); and reference numeral 81 denotes a positive electrode that is a high voltage side electrode of the secondary filter capacitor (hereinafter referred to as "secondary filter capacitor electrode").

The primary filter capacitor electrode 71 is electrically connected to a primary filter resistance 73 via a metal line 72. The primary filter resistance 73 is connected to a power supply pad or signal input/output pad 51. The secondary filter capacitor electrode 81 is electrically connected to a secondary filter resistance 83 via a metal line 82, and the secondary filter resistance 83 is connected to the primary filter resistance 73. In FIG. 3, reference numeral 52 denotes a ground pad, and reference numerals 53 and 54 denote ground lines.

In the RC filter circuit in FIG. 3, the level of an electromagnetic wave noise entering the semiconductor integrated circuit via the power supply pad or signal input/output pad 51, or the level of a surge or over-voltage applied to the power supply pad or signal input/output pad 51 is higher in the primary filter capacitor electrode 71 positioned close to the power supply pad or signal input/output pad 51 than in the secondary filter capacitor electrode 81.

Accordingly, in the present embodiment, an interval "b" between the primary filter capacitor electrode 71 and the peripheral internal circuit 61 is set at such an interval as to prevent malfunction of peripheral circuit elements resulting from a noise superimposed on the primary filter capacitor electrode 71 and prevent dielectric breakdown of the primary filter capacitor 7 and latch-up and dielectric breakdown of the peripheral circuits resulting from a surge applied to the primary filter capacitor electrode 71, as in the case of the previous embodiment. An interval "c" between the primary filter capacitor 71 and a peripheral line (in the example in FIG. 3, a metal line 82 connected to the secondary filter capacitor electrode 81) is formed and determined in a similar manner.

Specifically, although no particular limitation is imposed, the interval "b" or "c" is, for example, not less than the minimum interval required by a layout rule or about five times longer than the minimum interval required by a layout rule if a safety margin is considered. For example, if the minimum interval required by the layout rule is 2 $\mu$m, the interval "a" is 10 $\mu$m. Actually, the interval "b" or "c" is preferably determined with reference to a breakdown voltage of an insulating film or the like according to an actual process.

Figure 4:
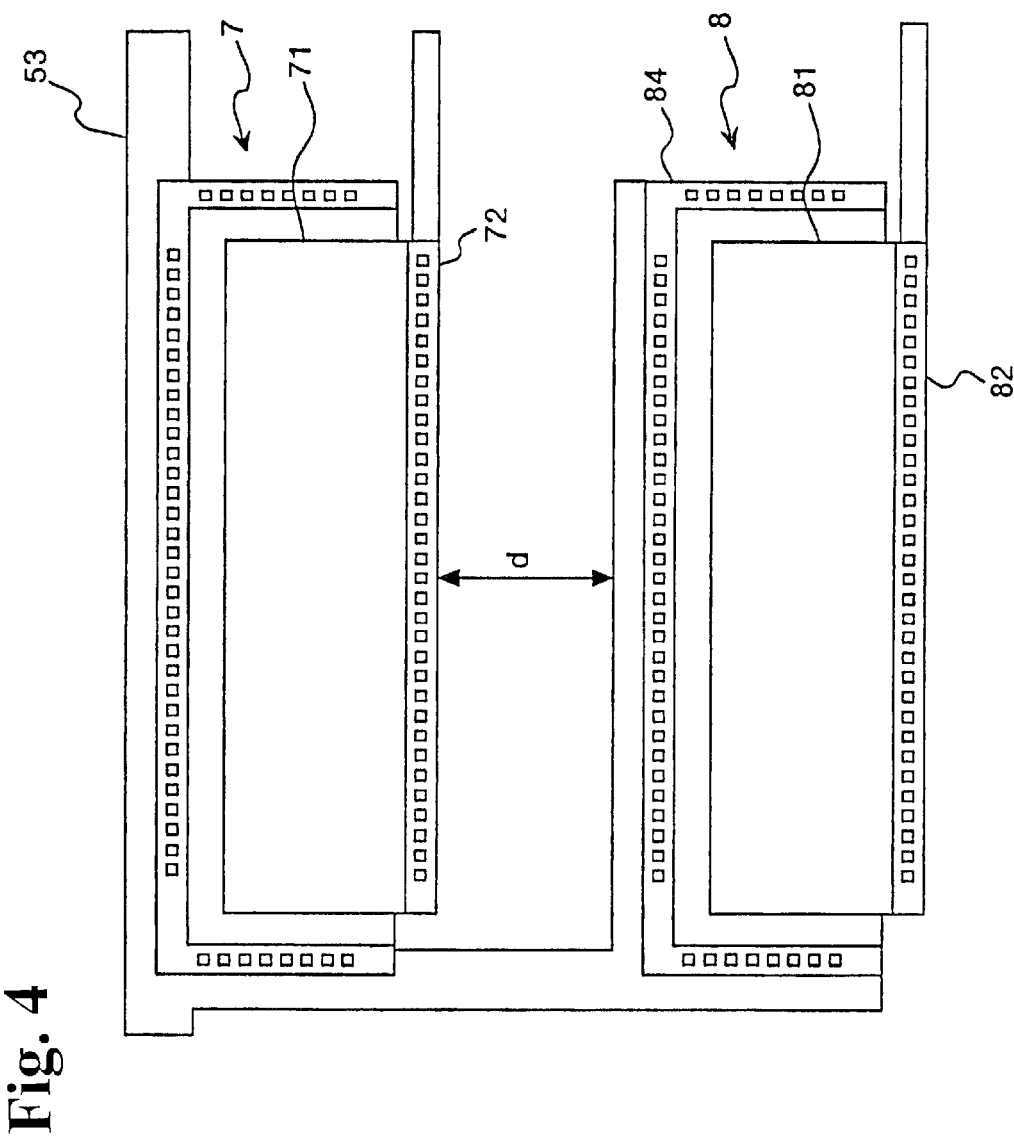
FIG. 4 is a schematic diagram showing an example of the arrangement of a primary filter capacitor and a secondary filter capacitor in the semiconductor integrated circuit according to another embodiment of the present invention.
Figure 5:
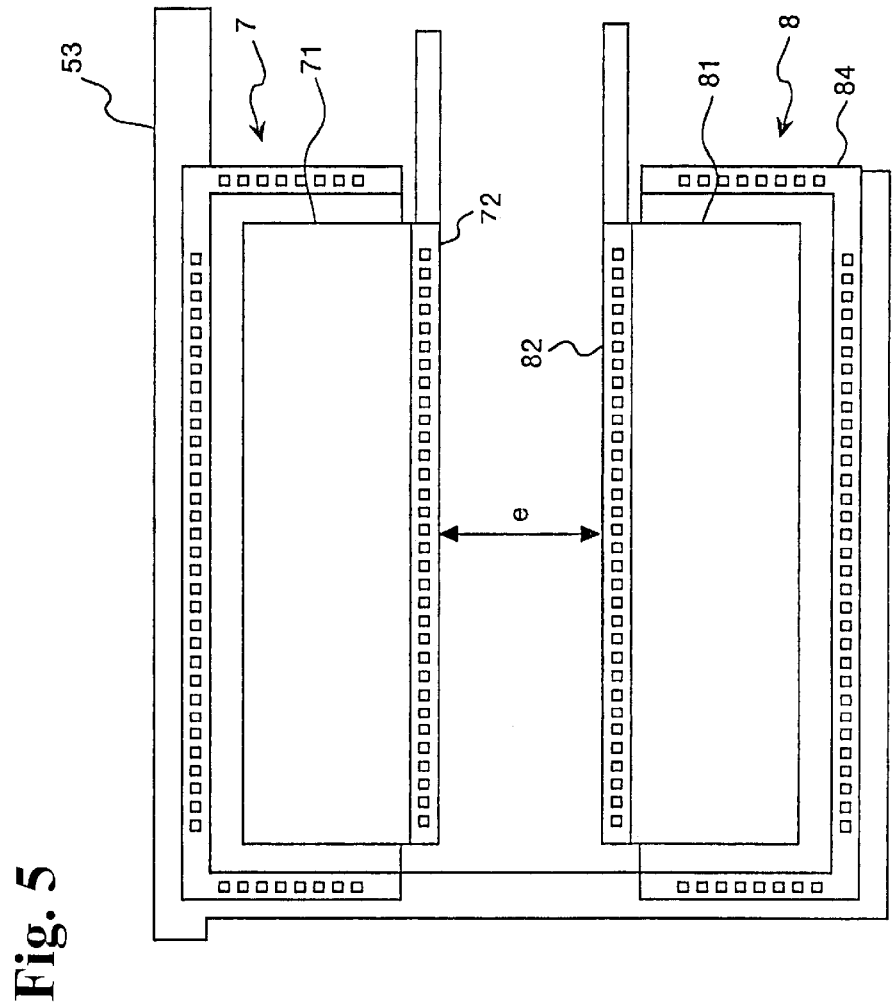
FIG. 5 is a schematic diagram showing another example of the arrangement of a primary filter capacitor and a secondary filter capacitor in the semiconductor integrated circuit according to another embodiment of the present invention.

According to the present embodiment, the primary filter capacitor 7 is disposed at the outer periphery of the IC chip 5 as shown in FIG. 3. The secondary filter capacitor 8 and the internal circuits 61, 62 are arranged inside the primary filter capacitor 7. In this layout, if a ground side electrode line 84 is provided in proximity to the primary filter capacitor electrode 71 as shown in FIG. 4, an interval "d" between the primary filter capacitor electrode 71 and the ground side electrode line 84 is set to the same interval as the interval "b" or "c". Further, if the secondary filter capacitor electrode 81 is positioned in proximity to the primary filter capacitor electrode 71 as shown in FIG. 5, an interval "e" between the primary filter capacitor 71 and the secondary filter capacitor electrode 81 is determined to be equal to the interval "b" or "c" The intervals "d" and "e" are also preferably determined with reference to a breakdown voltage of an insulating film or the like according to an actual process.

Figure 6:
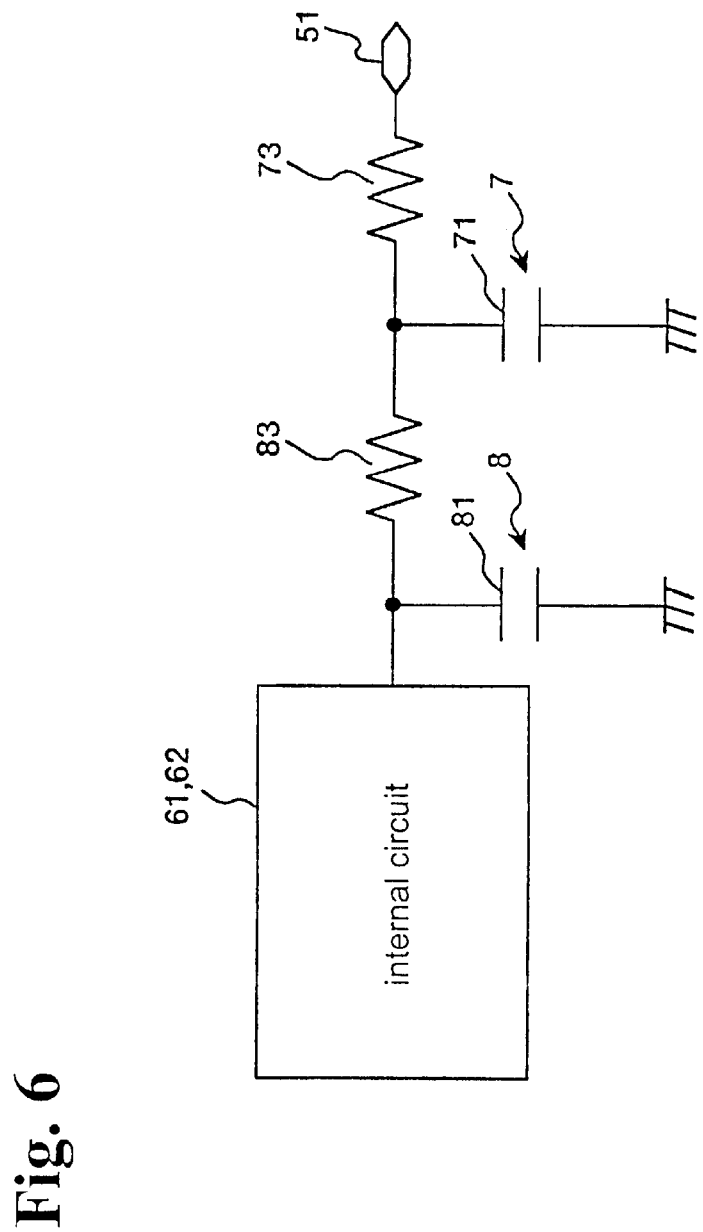
FIG. 6 is a diagram showing an equivalent circuit of the semiconductor integrated circuit, which constitutes the layout in FIG. 3.

FIG. 6 is a diagram showing an equivalent circuit of the semiconductor integrated circuit, which constitutes the layout in FIG. 3. It should be noted that parts and elements in FIG. 6 corresponding to those in FIG. 3 are denoted by the same reference numerals. The RC filter circuit comprised of the primary filter capacitor 7, the primary filter resistance 73, the secondary filter capacitor 8 and the secondary filter resistance 83, which are connected to the power supply pad or signal input/output pad 51, cuts electromagnetic wave noises entering the integrated circuit from outside.

According to the above-described embodiment, a noise superimposed on the primary filter capacitor electrode 71 can be inhibited from being transmitted to the peripheral analog circuits and digital circuits, and this prevents malfunction and breakdown of the circuits. Further, even if a surge is applied to the primary filter capacitor electrode 71, the concentration of electric fields occurring between the primary filter capacitor electrode 71 and the peripheral circuit elements or lines thereof can be alleviated to prevent dielectric breakdown of the primary filter capacitor 7 and the secondary filter capacitor 8.

Figure 7:
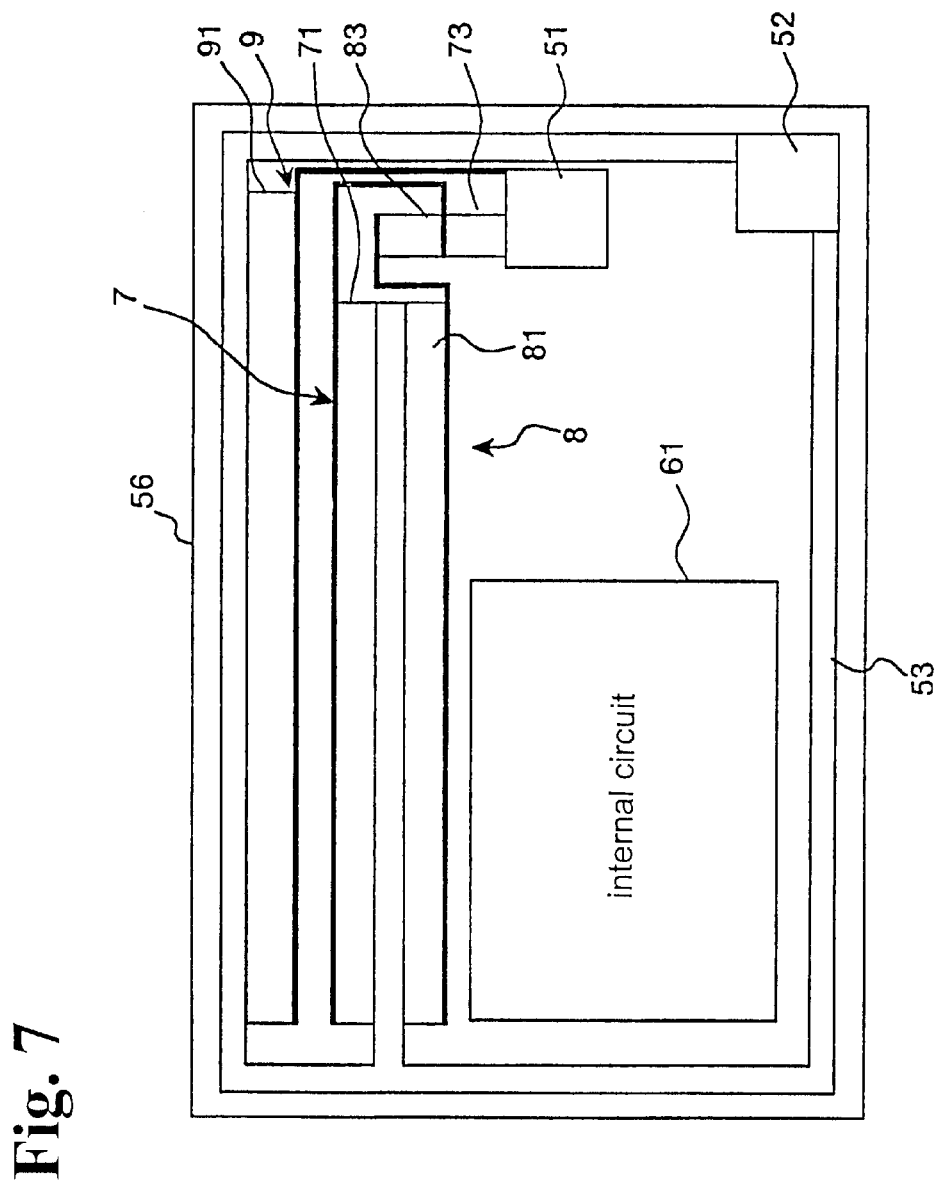
FIG. 7 is a schematic diagram showing a principal part of a layout of the semiconductor integrated circuit according to another embodiment of the present invention.
Figure 8:
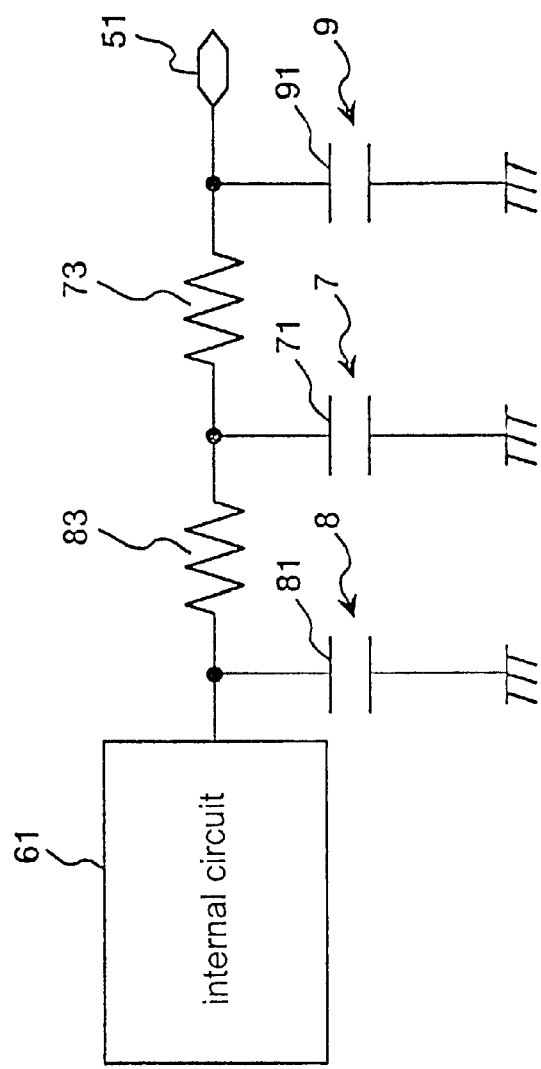
FIG. 8 is a diagram showing an equivalent circuit of an RC filter circuit that is constructed by adding a capacitor to the construction in FIG. 7.

It should be noted that as shown in FIGS. 7 and 8, a capacitor 9 may be added in proximity to the power supply pad or signal input/output pad 51 of the RC filter circuit constituting the secondary filter in order to remove or reduce noises generated in the internal circuit 61. This would prevent or inhibit noises generated in the IC chip 56 from being output to the outside. In this case, since electromagnetic wave noises, surges, or over-voltage superimposed on the signal input/output pad 51 are directly applied to a high voltage side electrode 91 of the additional capacitor 9, the interval between the high voltage side electrode 91 of the capacitor 9 and the peripheral circuit elements or lines thereof is determined to be equal to the above-mentioned intervals "b" or "e".

Figure 9:
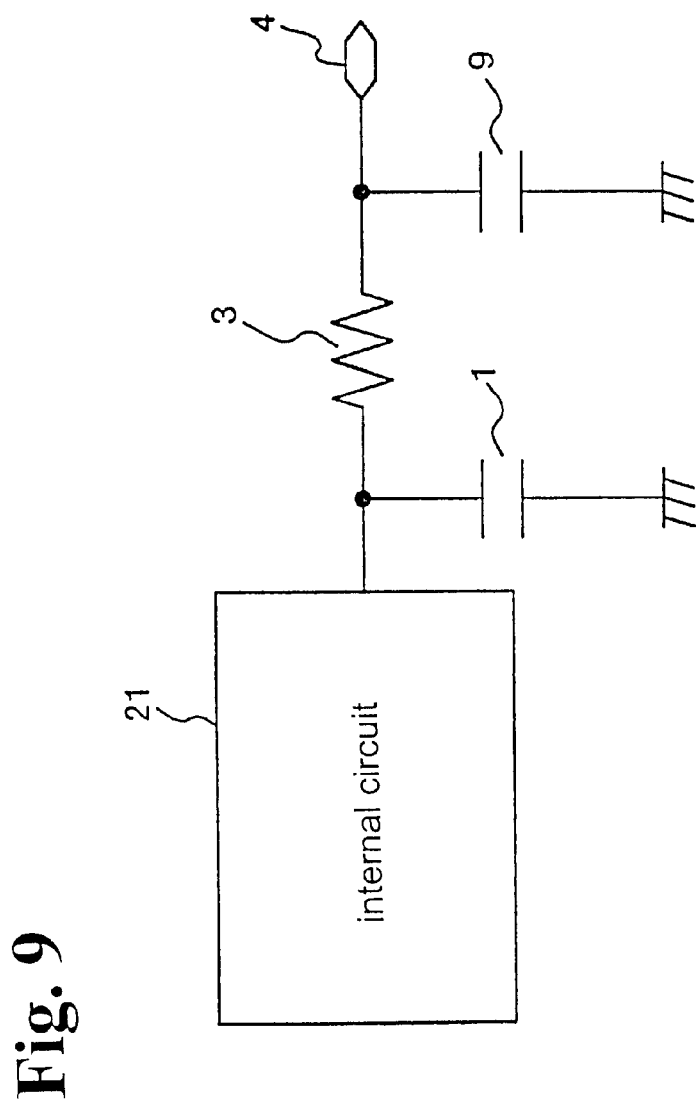
FIG. 9 is a diagram showing an equivalent circuit of an RC filter circuit that is constructed by adding a capacitor to the construction in FIG. 2.

Further, in the layout on the chip, the high voltage side electrode of the capacitor closest to the power supply pad or signal input/output pad 51, i.e. the high voltage side electrode 91 of the additional capacitor 9, is disposed at the outermost periphery of an IC chip 56, and the other filter capacitor electrodes 71, 81 are arranged in the order of stage inside the high voltage side electrode 91. To determine the arrangement of the capacitor electrodes and the intervals between the capacitor electrodes, it is preferable to consider the arrangement and intervals described with reference to FIGS. 4 and 5. This also applies to the case where the capacitor 9 is added in proximity to the power supply pad or signal input/output pad 4 in the RC filter circuit consisting only of the primary filter that is comprised of the capacitor 1 and the resistance 3 as shown in FIG. 9.

It should be understood that the present invention may be applied to an RC filter circuit that is comprised of a tertiary or higher stage filter.

According to the present invention, the high voltage side electrode of the capacitor constituting the RC filter is disposed apart from the circuit element or line closest to the RC filter at such an interval as to prevent the circuit element from malfunctioning due to the noise superimposed on the high voltage side electrode or to prevent dielectric breakdown of the capacitor and latch-up or dielectric breakdown of the circuit element caused by a surge applied to the high voltage side electrode. This inhibits the noise superimposed on the high voltage side electrode of the capacitor from being transmitted to the analog circuits and digital circuits, and thus prevents malfunction and breakdown of the circuits. Further, even if a surge is applied to the capacitor, the concentration of electric fields between the primary filter capacitor electrode and the peripheral circuit elements or lines can be alleviated to prevent dielectric breakdown of the capacitor.

Further, according to the present invention, in the case where the RC filter is comprised of a secondary filter and/or higher stage filters, the high voltage side electrode of the primary filter capacitor is disposed at a position that is apart from circuit elements or lines constituting analog circuits and digital circuits at such an interval as to prevent the circuit elements from malfunctioning due to a noise superimposed on the high voltage side electrode or to prevent dielectric breakdown of the capacitor constituting the RC filter and latchup or dielectric breakdown of the circuit elements caused by the surge applied to the high voltage side electrode. This inhibits the noise superimposed on the high voltage side electrode of the capacitor from being transmitted to the analog circuits and digital circuits, and thus prevents malfunction and breakdown of the circuits. Further, even if a surge is applied to the capacitor, the concentration of electric fields occurring between the primary filter capacitor electrode and the peripheral circuit elements or lines can be alleviated to prevent dielectric breakdown of the primary filter capacitor. It is also possible to prevent dielectric breakdown of the secondary and higher stage capacitors.

Further, according to the present invention, the primary filter capacitor is positioned at the outer periphery of the IC chip, and the secondary and higher stage capacitors are arranged in the order of stage inside the primary filter capacitor. The circuit elements other than the RC filter are arranged at the innermost side. This effectively inhibits the noise superimposed on the high voltage side electrode of the primary filter capacitor from being transmitted to the analog circuits and digital circuits to thus surely prevent malfunction and breakdown of the circuits. Further, even if a surge is applied to the high voltage side electrode of the primary filter capacitor, the concentration of electric fields can be alleviated between the high voltage side electrode and the peripheral circuit elements or lines. This surely prevents dielectric breakdown of the primary filter capacitor and dielectric breakdown of the secondary and higher stage capacitors.

While the invention has been explained with reference to the specific embodiments of the invention, the explanation is illustrative and the invention is limited only by the appended claims.

What is claimed is:

1. A layout of a semiconductor integrated circuit including a circuit element, a circuit line connected to the circuit element, and a resistance-capacitor filter having a capacitor with a high voltage side electrode, wherein the high voltage side electrode of the capacitor is disposed apart from the circuit element and the circuit line such that a smallest interval between the high voltage side electrode of the capacitor and the circuit element or the circuit line is about five times longer than a smallest adjacent spacing of the circuit element or the circuit line, or between the circuit element and the circuit line.

* * * * *

UNITED STATES PATENT AND TRADEMARK OFFICE
CERTIFICATE OF CORRECTION

PATENT NO. : 6,684,371 B2
DATED : January 27, 2004
INVENTOR(S) : Katsuyuki Uematsu et al.

It is certified that error appears in the above-identified patent and that said Letters Patent is hereby corrected as shown below:

<u>Column 5,</u>
Line 46, insert a period after ""c"".

Signed and Sealed this

Twentieth Day of April, 2004

JON W. DUDAS
*Acting Director of the United States Patent and Trademark Office*